United States Patent
Breen et al.

(10) Patent No.: US 7,296,164 B2
(45) Date of Patent: Nov. 13, 2007

(54) POWER MANAGEMENT SCHEME FOR EXTERNAL BATTERIES

(75) Inventors: John J. Breen, Harker Heights, TX (US); Jay L. Taylor, Georgetown, TX (US); Chris Young, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 463 days.

(21) Appl. No.: 10/963,679

(22) Filed: Oct. 13, 2004

(65) Prior Publication Data

US 2006/0080051 A1 Apr. 13, 2006

(51) Int. Cl.
G06F 1/00 (2006.01)
G06F 11/30 (2006.01)
(52) U.S. Cl. ...................... 713/300; 713/340
(58) Field of Classification Search ................ 713/300, 713/340
See application file for complete search history.

(56) References Cited

U.S. PATENT DOCUMENTS

| 5,404,546 | A | | 4/1995 | Stewart |
| 5,568,039 | A | | 10/1996 | Fernandez |
| 5,818,200 | A | | 10/1998 | Cummings et al. |
| 5,854,617 | A | * | 12/1998 | Lee et al. .................. 345/102 |
| 6,191,552 | B1 | | 2/2001 | Kates et al. |
| 6,262,562 | B1 | | 7/2001 | Cummings et al. |
| 6,373,222 | B2 | * | 4/2002 | Odaohhara ................. 320/116 |
| 6,417,791 | B1 | * | 7/2002 | Benmouyal et al. ........ 341/111 |
| 6,452,362 | B1 | * | 9/2002 | Choo ......................... 320/116 |
| 6,665,806 | B1 | * | 12/2003 | Shimizu ..................... 713/324 |
| 7,085,944 | B1 | * | 8/2006 | Hamilton .................... 713/320 |
| 2001/0032321 | A1 | * | 10/2001 | Nanno et al. ............... 713/300 |
| 2002/0138775 | A1 | * | 9/2002 | Hammond et al. ......... 713/310 |

* cited by examiner

*Primary Examiner*—Thomas Lee
*Assistant Examiner*—Ji H Bae
(74) *Attorney, Agent, or Firm*—Haynes and Boone, LLP

(57) ABSTRACT

In a method and system for managing power provided to a load, a power supply system includes a first power peripheral operable to receive and convert a first type of power to a second type of power. Also included in the power supply system is a second power peripheral operable to receive the second type of power and provide power to the load. A power event trigger device, which is included in the second power peripheral, is operable to introduce a trigger signal in the power to the load. The trigger signal, which is introduced in response to receiving a change in the second type of power, is detected as a power event.

18 Claims, 5 Drawing Sheets

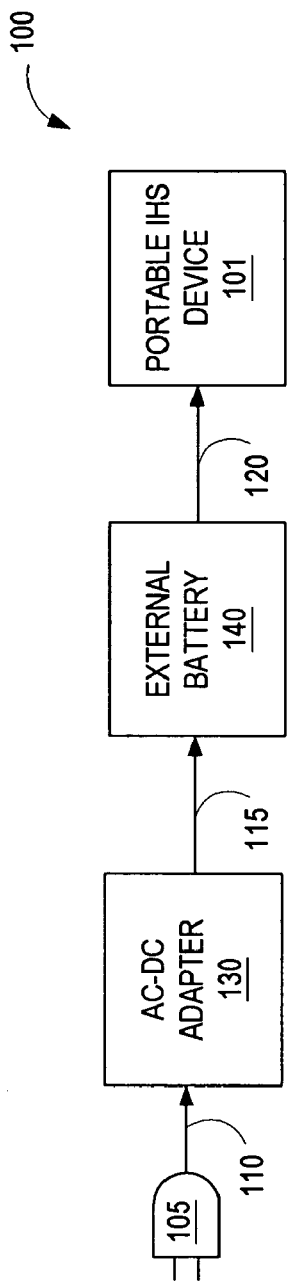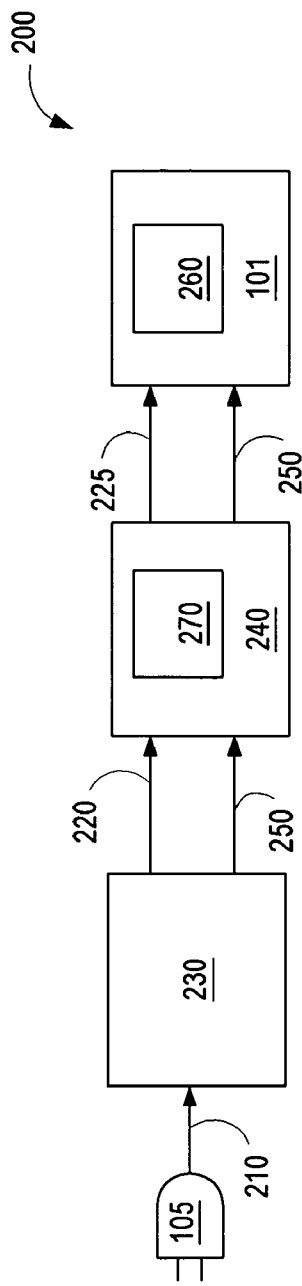

POWER MANAGEMENT SCHEME FOR EXTERNAL BATTERIES

BACKGROUND

The present disclosure relates generally to information handling systems, and more particularly to techniques for managing power provided to portable information handling system components such as notebook computers, personal digital assistants, cellular phones and gaming/entertainment devices.

As the value and use of information continues to increase, individuals and businesses seek additional ways to acquire, process and store information. One option available to users is information handling systems. An information handling system ('IHS') generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Various power management schemes exist to optimize battery life and thereby extend the operation of portable devices. For example, one or more batteries (including external and/or internal battery packs) may be configured to provide additional power to the IHS device. The IHS device may be placed in a battery-operated mode (BOM) of operation to conserve power by dimming its display panel.

FIG. 1 illustrates a block diagram of a power supply system 100 providing power to a portable IHS device 101, according to prior art. The power supply system 100 receives and converts an alternating current (AC) power input 110 to a direct current power (DC) output 120 to power a load such as the portable IHS device 101 or components thereof. The AC power input 110 is generally received from a 110-120 V, 60 Hertz or 220-230 V, 50 Hertz signal source from a wall outlet 105.

In some configurations, the power supply system 100 may include an optional external battery 140 connected in series between the AC-DC adapter 130 and the IHS device 101. In this configuration, an AC-DC adapter 130 converts the AC voltage input 110 to a first DC voltage output 115 to provide DC power to a load. The external battery 140 receives the first DC voltage output 115 as an input and generates the DC voltage output 120 as an output.

The external battery 140 typically functions as a pass-through device. That is, the first DC voltage output 115 is substantially passed through as an output. Thus, the DC voltage output 120 is substantially the same as the first DC voltage output 115. A typical voltage range for the minimum and maximum values for the first DC voltage output 115 and the DC voltage output 120 is between 17.5 volts to 19.5 volts. However, the specific voltage values for the first DC voltage output 115 and the DC voltage output 120 may vary depending on the manufacturer.

In some configurations, the DC voltage output 120 may be provided by external power sources such as an automobile's battery or an aircraft's DC power supply system. The DC voltage output 120 provided by these external power sources may be accepted as long as it is within the predetermined voltage range.

Maintaining compatibility and co-ordination of operation between various mix-n-match components of the power supply system 100 is often a challenge for users as well as manufacturers. A mismatch of component specifications such as wattage, voltage and current may result in an unsafe operation. For example, a potential malfunction of the power supply system 100 may occur if the AC-DC adapter 130 is not rated to carry sufficient power to charge the external battery 140 as well as an internal battery 150, both of which may be operable to provide power to the IHS device 101. Faulty operation of the power supply system 100 may potentially result in unsafe and/or hazardous conditions. As another example, since the external battery 140 acts as pass-through device, the output of the external battery 140 (assuming it has sufficient stored energy) remains substantially the same, independent of its input. Thus, power events such as plugging and/or unplugging of the AC power input 110 from the wall outlet 105 may go undetected, thereby resulting in a less-than-optimal performance of the portable IHS device 101.

Therefore, a need exists to provide an efficient method and system for managing power provided to portable IHS devices. Additionally, a need exists to provide an improved technique to detect power events such availability of AC power without substantially increasing costs and/or reducing performance. Accordingly, it would be desirable to provide an improved power management technique for managing various components of a power supply system included in an information handling system absent the disadvantages found in the prior methods discussed above.

SUMMARY

The foregoing need is addressed by the teachings of the present disclosure, which relates to a system and method for managing power provided to an IHS. According to one embodiment, in a method and system for managing power provided to a load, a power supply system includes a first power peripheral operable to receive and convert a first type of power to a second type of power. Also included in the power supply system is a second power peripheral operable to receive the second type of power and provide power to the load. A power event trigger device, which is included in the second power peripheral, is operable to introduce a trigger signal in the power to the load. The trigger signal, which is introduced in response to receiving a change in the second type of power, is detected as a power event.

In one embodiment, detecting a power event includes receiving a first value of an input indicative of an operating state of a power peripheral. A second value of the input indicative of a change in the state of the power peripheral is received. Receiving the second value is delayed relative to the receiving of the first value by a predetermined time interval. A difference between the first and second values is detected. An occurrence of a power event is identified in response to the difference.

Several advantages are achieved by the method and system according to the illustrative embodiments presented herein. The embodiments advantageously provide for an improved technique to generate power events in response to changes in operating state of one or more power peripherals included in a multi-peripheral power supply system. Thus, power events such as plugging or unplugging of AC power are detectable in a power supply system that includes a plurality of power peripherals. Triggering a power event advantageously enables BIOS to obtain updated power supply identifier (PSID) information for each of the power peripherals. This advantageously enables maintaining compatibility and co-ordination between the various power peripherals. In addition, it enables the IHS device to optimize for peak-performance based on the PSID information.

BRIEF DESCRIPTION OF THE DRAWINGS

FIG. 1 illustrates a block diagram of a power supply system providing power to a portable IHS.

FIG. 2 illustrates a block diagram of an improved power supply system providing power to a load, according to an embodiment.

DETAILED DESCRIPTION

Figure 3:
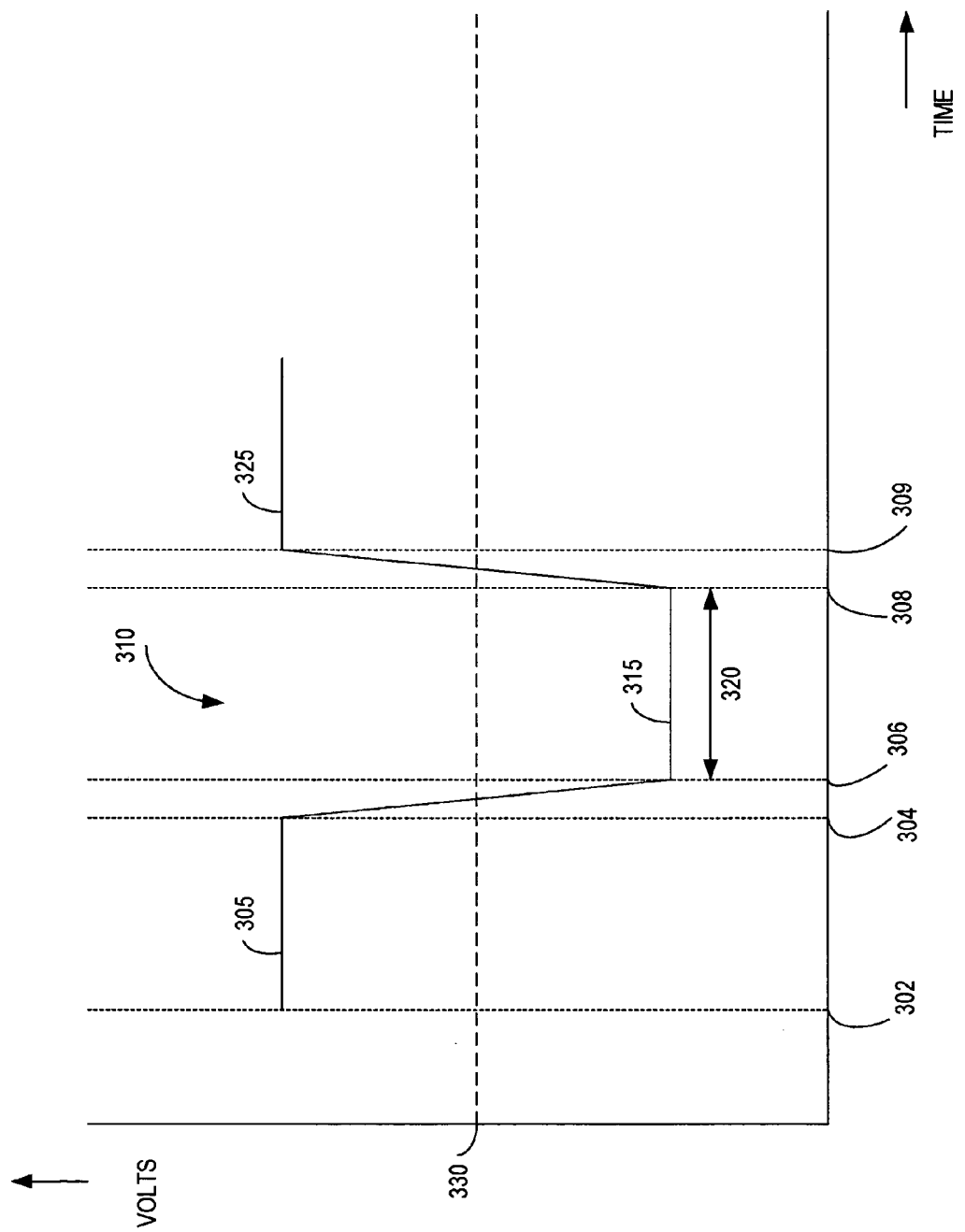
FIG. 3 illustrates a pulse signal triggering a power event in a portable IHS, according to an embodiment.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip), firmware (including application specific integrated circuits and programmable chips) and/or software or a combination thereof, depending on the application requirements.

The following terminology may be useful in understanding the present disclosure. It is to be understood that the terminology described herein is for the purpose of description and should not be regarded as limiting.

Without having a PSID scheme identifying various power peripherals included in a power supply system, maintaining compatibility and co-ordination of operation between the various mix-n-match power peripherals is often a challenge for users as well as manufacturers. PSID information is typically scanned/updated by BIOS of an IHS device in response to a power event. In a power supply system having multiple power peripherals such as external batteries, the PSID information is not readily available or is not updated due to the pass through signal characteristics of the external battery power peripheral. As such, the IHS is often operated in a less-than-optimal performance mode. This problem may be addressed by an improved system to manage power provided to a load. In the improved system using PSID information, an output of the power peripheral is modified to generate a power event in the IHS device, thereby enabling BIOS to update the PSID information.

According to one embodiment, in a method and system for managing power provided to a load, a power supply system includes a first power peripheral operable to receive and convert a first type of power to a second type of power. Also included in the power supply system is a second power peripheral operable to receive the second type of power and provide power to the load. A power event trigger device, which is included in the second power peripheral, is operable to introduce a trigger signal in the power to the load. The trigger signal, which is introduced in response to receiving a change in the second type of power, is detected as a power event.

FIG. 2 illustrates a block diagram of an improved power supply system 200 providing power to the portable IHS device 101, according to an embodiment. The power supply system 200 includes one or more power peripherals, devices or components, which are inter-connected in an arrangement to provide power to a load device such as the portable IHS device 101. In one embodiment, some power peripherals are operable to receive and convert power from one form or type to another. In one embodiment, some power peripherals may function as pass through devices. That is, the power peripherals may pass through a signal received as an input to generate an output signal, which is substantially the same as the input signal. In this embodiment, the power peripherals may not convert power from one type to another.

In the depicted embodiment, the power supply system 200 includes a first power peripheral 230 and a second power peripheral 240 electrically coupled to provide power to a load, e.g., the portable IHS device 101. The first power peripheral 230 receives and converts an input signal 210, which is indicative of power of a first type, to an intermediate output signal 220, which is indicative of a power of a second type. In this embodiment, the first power peripheral 230 is electrically coupled to the second power peripheral 240 in a cascade arrangement. That is, the intermediate output signal 220, which is an output of the first power peripheral 230, is received as an input by the second power peripheral 240. The second power peripheral 240 generates an output signal 225, which provides power to the portable IHS device 101.

In one embodiment, the first power peripheral 230 is an alternating current (AC) to a direct current (DC) (AC-DC) adapter device, which converts an AC power signal to a DC power signal. The input signal 210 may be an AC power input, which is generally received from a 120 V, 60 Hertz or 220 V, 50 Hertz signal source from the wall outlet 105. The intermediate output 220 is a DC signal, which may vary within a predefined DC voltage range. For example, in one embodiment, the intermediate output 220 varies approximately between 17.5 volts and 19.6 volts.

In one embodiment, the second power peripheral 240 is an external battery device. The external battery device is operable receive a charge from the first power peripheral 230, to store the charge in rechargeable battery cells (not shown) and provide power to the portable IHS device 101. In this embodiment, the second power peripheral 240 functions as a pass through device for the DC power signal since the output signal 225 is substantially the same as the intermediate output 220. In one embodiment, like the intermediate output 220, the output 225 varies approximately between 17.5 volts and 19.6 volts.

To address the compatibility and co-ordination issue amongst one or more power peripherals (including the first and second power peripherals 230 and 240) present within the power supply system 200, some IHS manufacturers such as Dell Products, LP (Round Rock, Tex., USA) have provided a smart power supply system, which includes a power supply identification (PSID) scheme to identify the various types of power supply sources present. Information included in a PSID for each power peripheral may include attributes such as power type (e.g., AC or DC), wattage/voltage/ current rating, peripheral manufacturer, part number, country of origin and similar others. Availability of such PSID information is advantageously used to match components and improve co-ordination between various power peripherals, thereby improving performance and increasing reliability and safety of the portable IHS device 101.

For example, when a legacy AC-DC adapter without PSID (not shown but similar to the AC-DC adapter 130) is attached to the portable IHS device 101, information about the source of power is unknown to the device 101. As such, the BIOS sets the operation of the device 101 in a safe, battery optimized mode and disables the charging of the internal batteries (not shown). This may result in a less than optimal performance of the device 101. As another example, when an AC-DC adapter with PSID (e.g., first power peripheral 230) is electrically coupled to the portable IHS device 101, the source of power is known. The portable IHS device 101 will operate at a pre-determined power level (identified by BIOS), based on the AC-DC adapter capacity identified in the PSID information for that peripheral. Since the power type and wattage rating is known the portable IHS device 101 will advantageously enable charging of the internal batteries. An external battery with PSID (e.g., the second power peripheral 240) is connected in-between but will charge at no more than the BIOS identified power level (e.g., 65 W).

In order to determine its power source and optimize its performance, a controller 260 included within the portable IHS device 101 sends a request signal to one or more power peripherals over a bi-directional PSID line 250 to request PSID information. Each power peripheral, which is queried, sends a response signal over the PSID line 250. The response signal includes the requested PSID attribute information. For example, a response may include information such as 'DC 150' or 'AC 100'. The DC 150 may indicate a DC type power source rated to operate at 150 watts, and the AC 100 may indicate an AC type power source rated to operate at 100 watts. In the depicted embodiment, the PSID information provided by the first power peripheral 230 passes through the second power peripheral 240 and is delivered to the portable IHS device 101.

Such requests or queries for PSID information are triggered in response to power events such as plugging or unplugging of AC-DC adapter from the wall socket 105. Examples of power events may include power up or transition to internal battery power from the external AC-DC adapter 130, or DC input voltage exceeding a threshold value. Thus, one such power event may be defined as a change in voltage value of the output 225. In one embodiment, the controller 260 in the portable IHS device 101 monitors the output 225 for a change in value. For example, a change in voltage of the output 225 from an initial 19.6 volt level suggests a change in the power source. In response to the change in the output 225, the portable IHS device 101 queries power peripherals for new/revised PSID information. Requesting and reading of PSID information is accomplished in hardware, resulting in an interrupt to the controller 260 whenever the DC voltage input (e.g., output 225) crosses the predetermined threshold value. Additional details of generating a power event are described in FIG. 3.

Alternative techniques for identifying power supply may be utilized. As described earlier, PSID refers to a digital identification encoded in semiconductor chip included in power peripherals. In one embodiment, the PSID may be a certain current or voltage level present on a sense line such as line 250. In one embodiment, PSID information may be superimposed on a signal or power line. Querying for PSID information may be a transient event appearing only during state transitions or may be present as a steady state signal. In one embodiment, PSID information may be obtained synchronously with a timing signal or asynchronously.

Referring back to FIG. 2, the first and second power peripherals 230 and 240 may be connected to the device 101 in various arrangements. In one embodiment, a first arrangement may include the first power peripheral 230 receiving power from the wall outlet 105 being directly connected to the device 101. In this arrangement, the second peripheral 240 is not present and PSID information of the first power peripheral 230 is provided to the controller 260 at the occurrence of a power event. In one embodiment, a second arrangement may include the second power peripheral 240 having sufficient stored energy being directly connected to the device 101. In this arrangement, the first power peripheral 230 is not present and PSID information of the second power peripheral 240 is provided to the controller 260 at the occurrence of a power event. In one embodiment, the second arrangement may be changed to a third arrangement by connecting the first power peripheral 230 to provide DC power to the second power peripheral 240. The depicted embodiment is illustrative of the third arrangement. In the third arrangement, when the first power peripheral 230 is first plugged in the wall outlet 105 it generates the intermediate output 220 thereby causing a power event in the device 101. The PSID information of the first power peripheral 230 is passed through by the second power peripheral 240 to the controller 260.

In one embodiment, a power event trigger component 270 included in the second power peripheral 240 is operable to generate a change in the output 225 in response to a change in the intermediate output 220, thereby advantageously generating a power event detectable by the controller 260 of the portable IHS device 101. In one embodiment, the output 225 is pulsed. That is, the output 225 is changed in the form of a pulse signal having a predetermined width. In one embodiment, the change in the output 225 is caused due to a change in the intermediate output 220, which in turn is caused as a result of plugging or unplugging of AC power input from the wall outlet 105.

Referring to FIG. 3, a pulse signal triggering a power event is illustrated, according to an embodiment. At time $t_0$ 302, the power supply system 200 is operating in a steady state and the intermediate output 220 and the output 225 are substantially the same. The output 225 has a first value 305, which is above a threshold value 330. At time $t_1$ 304, the input 210 to the first power peripheral 230 is installed or removed. As a result, the intermediate output 220 changes. At time $t_2$ 306, the second power peripheral 240 detects the change in its input and pulses its output, thereby causing a change in the output 225. Now the output 225 has a second value 315, which is below the threshold value 330. That is, a change is caused by switching the output 225 to generate a pulse signal 310 having a predetermined width 320. Further detail of the second power peripheral 240, which includes a switching mechanism for the output 225, is described in FIG. 4.

Referring back to FIG. 3, the pulse signal 310 causes the voltage of the output signal 225 to decrease below a threshold voltage level 330 for a predetermined amount of time corresponding to the predetermined width 320. Thus, by lowering the voltage level of the output 225 below a threshold level within the time duration of the predetermined width 320, the pulse signal 310 triggers an interrupt to the controller 260 and generates a power event.

By advantageously having a power event occur when power peripherals are attached or detached, the controller 260 is automatically triggered to read/update the PSID information to adjust power parameters and device performance accordingly. The end of the predetermined time occurs at time $t_3$ 308. Between time $t_3$ 308 and time $t_4$ 309, the output 220 returns to a third value 325, which is the same as its previous voltage level (e.g., the first value 305). The specific threshold voltage level selected is dependent on the type of internal and/or external batteries included. In one embodiment, the threshold voltage level is 17.5 volts. For certain types of IHS devices such as PDA's, portable game devices and cell phones, the value of the threshold voltage may be lower. The predetermined width 320 is optimally selected so that it is not too large to cause an interruption in power provided to the portable IHS device 101 and is not too small to be undetected by the portable IHS device 101. In one embodiment, the predetermined width 320 is at least 150 microseconds.

Figure 4:
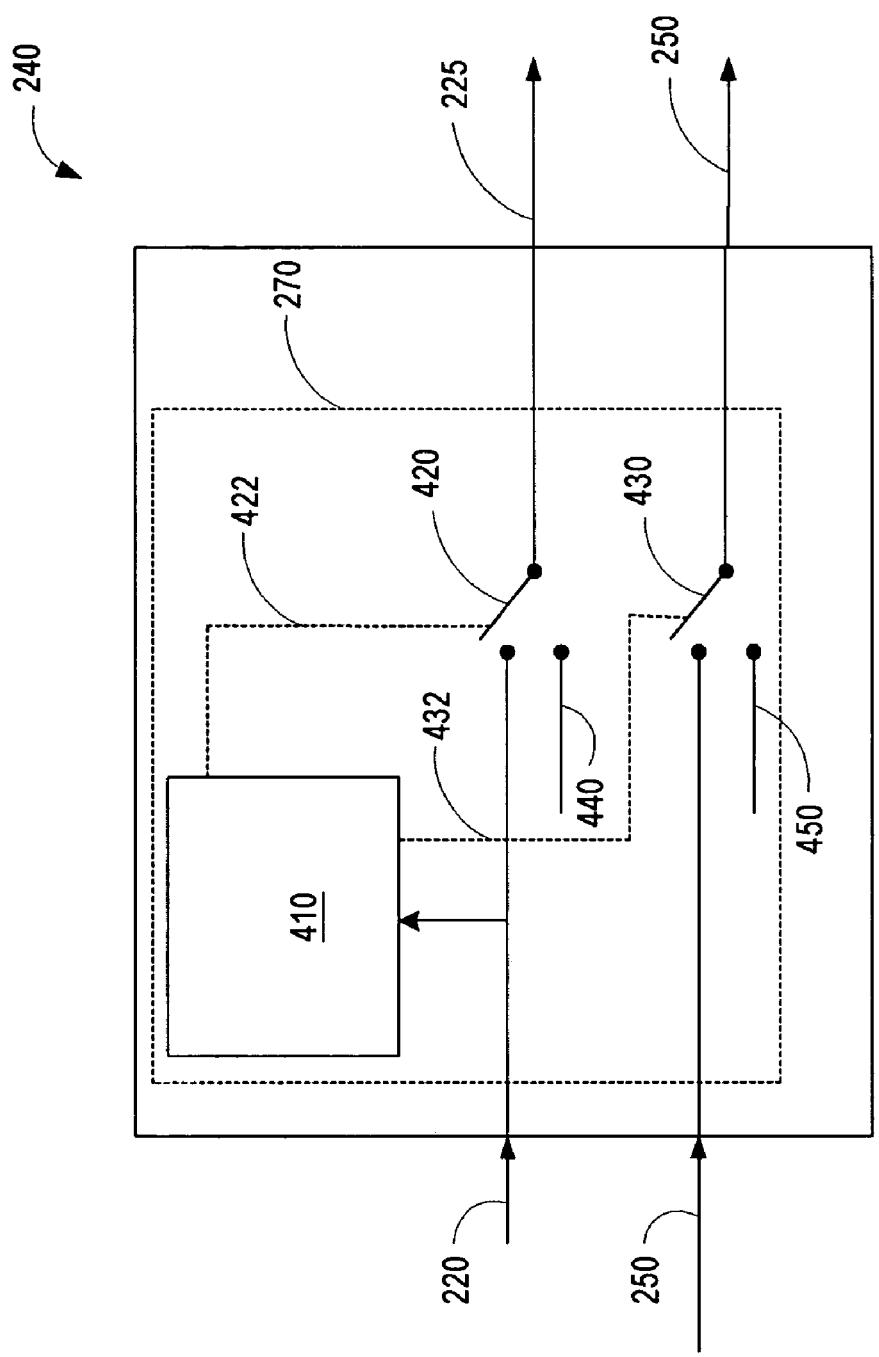
FIG. 4 illustrates a block diagram showing details of a second power peripheral of FIG. 2, according to an embodiment.

FIG. 4 is a block diagram illustrating additional details of the second power peripheral 240, according to an embodiment. The second power peripheral 240 receives the intermediate output 220 and the PSID line 250 as input and generates the output 225 and the PSID line 250 as outputs. In one embodiment, a standard 3-pin coaxial connector (not shown) is used for inputs and outputs, with the center pin being used as the PSID line 250.

The power event trigger component 270 includes a detection component 410 and switches 420 and 430. The detection component 410 is operable to monitor the intermediate output 220 for any changes. When the detection component 410 detects a change, control signals 422 and 432 are sent to the switches 420 and 430 to open or close them. In one embodiment, only one control signal is sent to the switches 420 and 430. In one embodiment, the switches 420 and 430 are implemented using well-known field effect transistor (FET) devices.

The switch 420 is operable to select one of the intermediate output 220 signal or an internal power source 440 of the external battery as the output 225 signal in response to receiving or not receiving the input 210. For example, when the input 210 is not received (for e.g., when AC power in unplugged from the wall outlet 105), the switch 420 is operable to connect the internal power source 440 of the external battery to the output 225. Similarly, the switch 430 is operable to pass through the PSID line 250 received from the first power peripheral 230 or switch to an internal PSID line 450 (indicative of the second power peripheral 240) as the PSID line 250.

In one embodiment, the switches 420 and 430 are operable to generate the waveform described in FIG. 3. That is, the switch 420 is operable to the pulse the output 225 to generate the pulse signal 310, in response to the detection component 410 detecting a change. The switch 420 is turned on or off for a predetermined amount of time (indicated by the predetermined width 320). This causes the output 225 to decrease below the threshold level within the time duration of the predetermined width 320 and generate a power event in the controller 260 (not shown).

Figure 5:
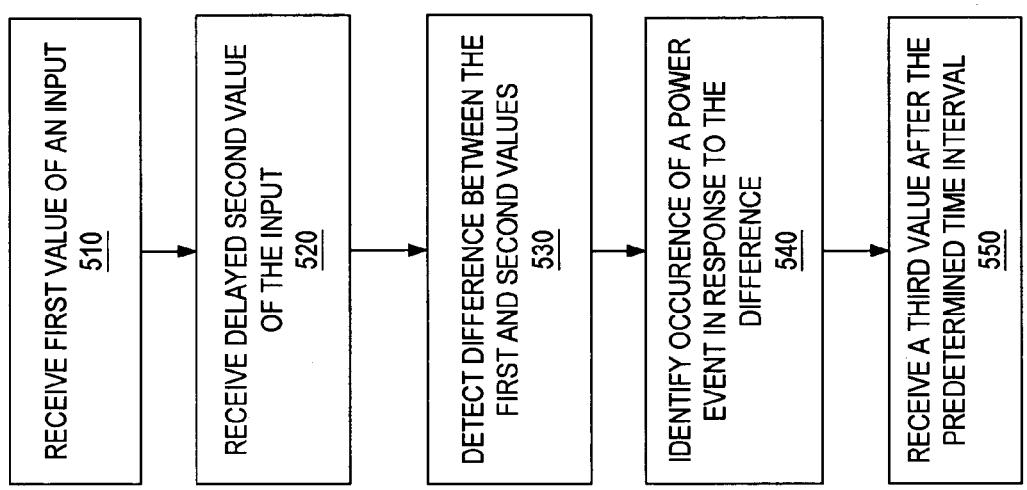
FIG. 5 illustrates a flow chart of a method for detecting a power event, according to an embodiment.

FIG. 5 is a flow chart illustrating a method for detecting a power event, according to an embodiment. In step 510, a first value of an input indicative of an operating state of a power peripheral is received. For example, the controller 260 receives the output 225 having a first voltage value, which is above the threshold voltage level 330. In one embodiment, the first voltage value being above the threshold voltage level 330 is indicative of an operating state of the first power peripheral 230 such as operating. In step 520, a second value of the input indicative of a change in the state of the power peripheral is received. Receiving the second value is delayed relative to the receiving of the first value by a predetermined time interval. For example, in response to a change in the operating state of the first power peripheral 230, the output 225 is pulsed. The controller 260 receives a second voltage value of the output 225, which is below the threshold voltage level 330. The duration of the predetermined time interval is the predetermined width 320. In step 530, a difference between the first and second values is detected. That is, the controller 260 detects a difference in the output 225 from a first voltage value (exceeding the threshold level 330) to a second voltage value (below the threshold level 330). In step 540, occurrence of a power event is identified in response to the difference. In step 550, a third value of the input is received after the predetermined time interval, with the third value being substantially equal to the first value received. Various steps described above may be added, omitted, combined, altered, or performed in different orders.

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, the IHS may be a personal computer, including notebook computers, personal digital assistants, cellular phones, gaming consoles, a network storage device, or any other suitable device and may vary in size, shape, performance, functionality, and price.

The IHS may include random access memory (RAM), one or more processing resources such as a central processing unit (CPU) or hardware or software control logic, ROM, and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses operable to transmit communications between the various hardware components.

Figure 6:
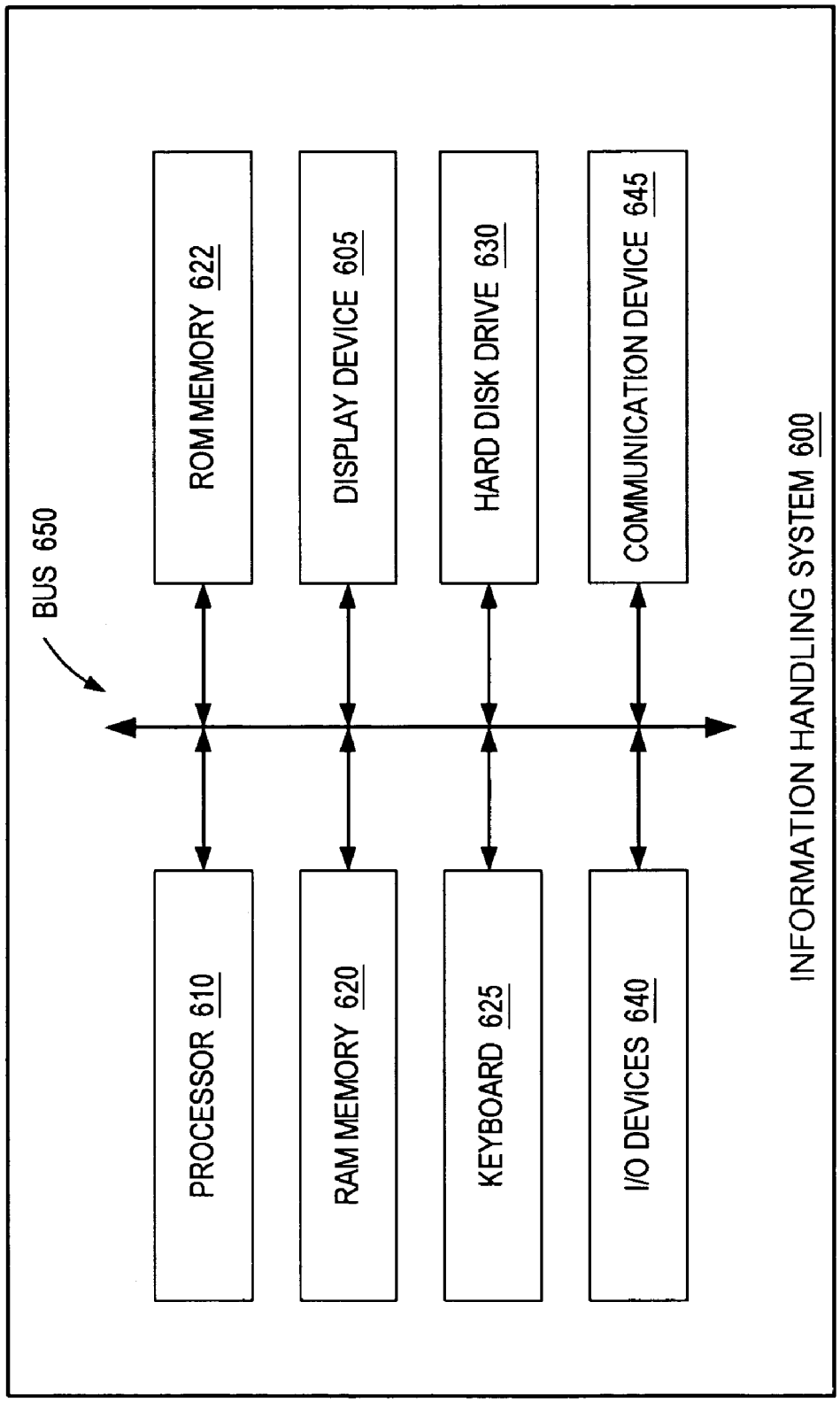
FIG. 6 illustrates a block diagram of an information handling system having an improved power supply system, according to an embodiment.

FIG. 6 illustrates a block diagram of an information handling system 600 having an improved power supply system (not shown), according to an embodiment. The information handling system 600 includes a processor 610, a system random access memory (RAM) 620 (also referred to as main memory), a non-volatile ROM 622 memory, a display device 605, a keyboard 625 and an I/O controller 640 for controlling various other input/output devices. In one embodiment, the I/O controller 640 is substantially the same as the controller 260 of FIG. 2. It should be understood that the term "information handling system" is intended to encompass any device having a processor that executes instructions from a memory medium. The IHS 600 is shown to include a hard disk drive 630 connected to the processor 610 although some embodiments may not include the hard disk drive 630. The processor 610 communicates with the system components via a bus 650, which includes data, address and control lines. In one embodiment, the IHS 600 may include multiple instances of the bus 650. A communications controller 645, such as a network interface card, may be connected to the bus 650 to enable information exchange between the IHS 600 and other devices (not shown).

In one embodiment, the portable IHS 101 device described in FIG. 1 is implemented as the IHS 600. In this embodiment, the improved power supply system 200 (not shown) described in FIG. 2 provides power to one or more components of the IHS 600.

The processor 610 is operable to execute the computing instructions and/or operations of the IHS 600. The memory medium, e.g., RAM 620, preferably stores instructions (also known as a "software program") for implementing various embodiments of a method in accordance with the present disclosure. In various embodiments the one or more software programs are implemented in various ways, including procedure-based techniques, component-based techniques, and/or object-oriented techniques, among others. Specific examples include assembler, C, XML, C++ objects, Java and Microsoft Foundation Classes (MFC).

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. Accordingly, it is appropriate that the appended claims be construed broadly and in a manner consistent with the scope of the embodiments disclosed herein.

What is claimed is:

1. A power supply system operable to provide power to a load, the system comprising:
   a first power peripheral operable to receive and convert a first type of power to a second type of power;
   a second power peripheral operable to receive and provide the second type of power to the load; and
   a power event trigger device included in the second power peripheral, wherein the power event trigger device is operable to introduce a trigger signal in the power to the load, the trigger signal being introduced in response to receiving a change in the second type of power, wherein the trigger signal is a pulse signal having a predetermined pulse width.

2. The system of claim 1, wherein the first power peripheral is identified by a first power supply identifier (PSID), wherein the second power peripheral is identified by a second PSID, wherein the first PSID is passed through to the load when the first power peripheral is operational, wherein the second PSID is passed to the load when the first power peripheral is not operational.

3. The system of claim 1, wherein the pulse width is at least 150 microseconds.

4. The system of claim 1, wherein a voltage value of the second type of power is greater than a predefined voltage level.

5. The system of claim 4, wherein the trigger signal causes the voltage value to change to another voltage value, wherein the another voltage value is less than the predefined voltage level.

6. The system of claim 4, wherein the predefined voltage level is approximately equal to 17.5 volts.

7. The system of claim 1, wherein the trigger signal causes a change in a value of a power supply identifier (PSID) passed to the load, wherein each one of the first and second power peripherals include a corresponding PSID.

8. The system of claim 1, wherein the first power peripheral is an AC-DC converter and the second power peripheral is an external battery.

9. A method for detecting a power event, the method comprising:
   receiving a first value of an input indicative of an operating state of a power peripheral, wherein the first value is greater than a predefined voltage level;
   receiving a second value of the input indicative of a change in the operating state of the power peripheral;
   receiving a third value of the input after a predetermined time interval, wherein the third value is substantially equal to the first value;
   detecting a difference between the first and second values; and
   identifying the power event in response to the difference;
   wherein a power supply identifier (PSID) identifies the power peripheral, and wherein the change in the operating state causes a change in the PSID.

10. The method of claim 9, wherein the second value is less than the predefined voltage level.

11. The method of claim 9, wherein the second value is less than the predefined voltage level for at least the predetermined time interval.

12. The method of claim 9, wherein the predefined voltage level is approximately equal to 17.5 volts.

13. The method of claim 9, wherein the predetermined time interval is at least 150 microseconds.

14. The method of claim 9, wherein the change in the operating state occurs in response to a change in an input received by the power peripheral.

15. The method of claim 9, wherein the power peripheral is an external battery.

16. An information handling system (IHS) comprising:
   a processor;
   a storage coupled to the processor; and
   a power supply operable to provide power to the processor, wherein the power supply includes:
      a first power peripheral operable to receive and convert a first type of power to a second type of power;
      a second power peripheral operable to receive and provide the second type of power to the processor; and
      a power event trigger device included in the second power peripheral, wherein the power event trigger device is operable to introduce a trigger signal in the power to the processor, the trigger signal being introduced in response to receiving a change in the second type of power, wherein the trigger signal is a pulse signal having a predetermined pulse width.

17. The system of claim 16, wherein a voltage value of the second type of power is greater than a predefined voltage level.

18. The system of claim 17, wherein the trigger signal causes the voltage value to change to another voltage value, wherein the another voltage value is less than the predefined voltage level.

* * * * *